US007668271B2

(12) United States Patent
Kim et al.

(10) Patent No.: US 7,668,271 B2
(45) Date of Patent: Feb. 23, 2010

(54) CLOCK-DATA RECOVERY ("CDR") CIRCUIT, APPARATUS AND METHOD FOR VARIABLE FREQUENCY DATA

(75) Inventors: Dennis Kim, San Francisco, CA (US); Jason Wei, Cupertino, CA (US); Yohan Frans, Palo Alto, CA (US); Todd Bystrom, Los Altos, CA (US); Nhat Nguyen, San Jose, CA (US); Kevin Donnelly, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 306 days.

(21) Appl. No.: 10/675,027

(22) Filed: Sep. 30, 2003

(65) Prior Publication Data

US 2005/0069071 A1     Mar. 31, 2005

(51) Int. Cl.
*H04L 7/00* (2006.01)
(52) U.S. Cl. ...................................... 375/354
(58) Field of Classification Search ......... 375/354–356, 375/359, 360, 362, 371, 373, 375, 376; 327/126, 327/91, 94, 141, 144–148, 151, 160, 155–157, 327/163
See application file for complete search history.

(56) References Cited

U.S. PATENT DOCUMENTS

| | | | | |
|---|---|---|---|---|
| 3,773,975 A | * | 11/1973 | Koziol | 375/303 |
| 4,330,862 A | * | 5/1982 | Smolik | 375/316 |
| 5,572,558 A | * | 11/1996 | Beherns | 375/376 |
| 5,592,109 A | * | 1/1997 | Notani et al. | 327/3 |
| 5,661,765 A | * | 8/1997 | Ishizu | 375/376 |

(Continued)

FOREIGN PATENT DOCUMENTS

JP     02000035831 A     2/2000

OTHER PUBLICATIONS

Brugel et al., "Variable Bandwidth DPLL Bit Synchronizer with Rapid Acquisition Implemented as a Finite State Machine" IEEE Transactions on Communications, vol. 42, No. 9, Sep. 1994, pp. 2751-2759.*

*Primary Examiner*—Mohammad H Ghayour
*Assistant Examiner*—Vineeta S Panwalkar
(74) *Attorney, Agent, or Firm*—Vierra Magen Marcus & DeNiro LLP

(57) ABSTRACT

A circuit, such as a CDR circuit, includes a sampler to receive a data signal having a variable data bit-rate responsive to a clock signal in an embodiment of the present invention. A clock circuit is coupled to the sampler and generates the clock signal responsive to a selectable update rate and a selectable phase adjust step-size. In a second embodiment of the present invention, the circuit includes a Stall logic that is coupled to first, second and third stages and is capable to hold the phase adjust signal responsive to the first and second stage output signals. In a third embodiment of the present invention, an indicator detects the variable data bit-rate and a counter provides the selectable phase adjust step-size for the adjust signal. In a fourth embodiment of the present invention, the circuit includes the Stall logic, the indicator and the counter. In a fifth embodiment of the present invention, the circuit includes an Averaging circuit to output a phase adjust signal responsive to the averaging of a first and second adjust signals for a predetermined period of time.

27 Claims, 11 Drawing Sheets

U.S. PATENT DOCUMENTS

| | | |
|---|---|---|
| 5,742,798 A | 4/1998 | Goldrian |
| 5,754,352 A * | 5/1998 | Behrens et al. ............... 360/51 |
| 5,838,749 A * | 11/1998 | Casper et al. ............... 375/376 |
| 5,987,238 A * | 11/1999 | Chen ............................. 716/1 |
| 6,041,090 A * | 3/2000 | Chen ........................... 375/376 |
| 6,104,251 A * | 8/2000 | Ramey et al. ................ 331/14 |
| 6,285,228 B1 * | 9/2001 | Heyne et al. ................. 327/246 |
| 6,307,906 B1 * | 10/2001 | Tanji et al. .................. 375/376 |
| 6,366,628 B1 * | 4/2002 | Su et al. ...................... 375/355 |
| 6,642,747 B1 * | 11/2003 | Chiu ........................... 327/40 |
| 6,963,629 B2 * | 11/2005 | Boerstler et al. ............ 375/376 |
| 2002/0030522 A1 * | 3/2002 | Nakamura .................. 327/165 |
| 2003/0128786 A1 * | 7/2003 | Schmatz et al. ............. 375/359 |

* cited by examiner

US 7,668,271 B2

CLOCK-DATA RECOVERY ("CDR") CIRCUIT, APPARATUS AND METHOD FOR VARIABLE FREQUENCY DATA

FIELD OF THE INVENTION

The present invention relates to communication systems, and in particular, serial link systems.

BACKGROUND OF INVENTION

A serial data system consists of a transmit circuit for transmitting data bits on a serial link to a receive circuit. In a serial data system, the timing information to sample the incoming data signal is embedded in the data stream. To recover a time to sample or clock the incoming data signal, most receive circuits include a Clock-Data Recovery ("CDR") circuit to synchronize a sample clock with the incoming data. A CDR circuit actively looks for transitions in the incoming data and phase aligns a sample clock signal with respect to the incoming data transitions to provide maximum setup-hold timing margins.

A CDR circuit is typically responsible for tracking incoming data over a range of bit-rates. However, the bit-rate of the incoming data may be different than the frequency of the sample clock. Further, the bit-rate of the incoming data may vary over time with respect to the sample clock frequency. For example, the bit-rate of an incoming data signal may range between 1.50045 GHz and 1.49955 GHz at any particular time. In other words, a CDR circuit needs to track a data signal having a bit-rate of approximately 1.5 GHz±300 parts per million ("ppm").

Therefore, it is desirable to provide a circuit, such as a CDR circuit, apparatus and method that is capable of synchronizing a sample clock signal to incoming data even when such incoming data has a high variable data bit-rate.

DETAILED DESCRIPTION

In an embodiment of the present invention, a circuit, such as a CDR circuit, includes a sampler to receive, in response to a Dclk clock signal, a data signal having a variable data bit-rate. A Clock circuit is coupled to the sampler and generates the Dclk clock signal responsive to a phase adjust signal. A Phase Adjuster controller generates the Phase Adjust signal responsive to a Phase Adjust Step-Size signal. The value of the Phase Adjust Step-Size signal is dependent upon phase differences between the data signal and the Dclk clock signal.

In a another embodiment of the present invention, the circuit includes Stall logic that is coupled to first, second and third stages of a CDR circuit and is capable of holding the Phase Adjust signal responsive to the first and second stage output signals.

In another embodiment of the present invention, an indicator detects the variable data bit-rate and a counter adjusts the phase adjust step-size for the Phase Adjust signal.

In another embodiment of the present invention, the circuit includes Stall logic, the indicator and the counter.

In another embodiment of the present invention, the circuit includes an Averaging circuit to output a Phase Adjust signal responsive to the average of a first and second Phase Adjust signals for a predetermined period of time.

Figure 1:
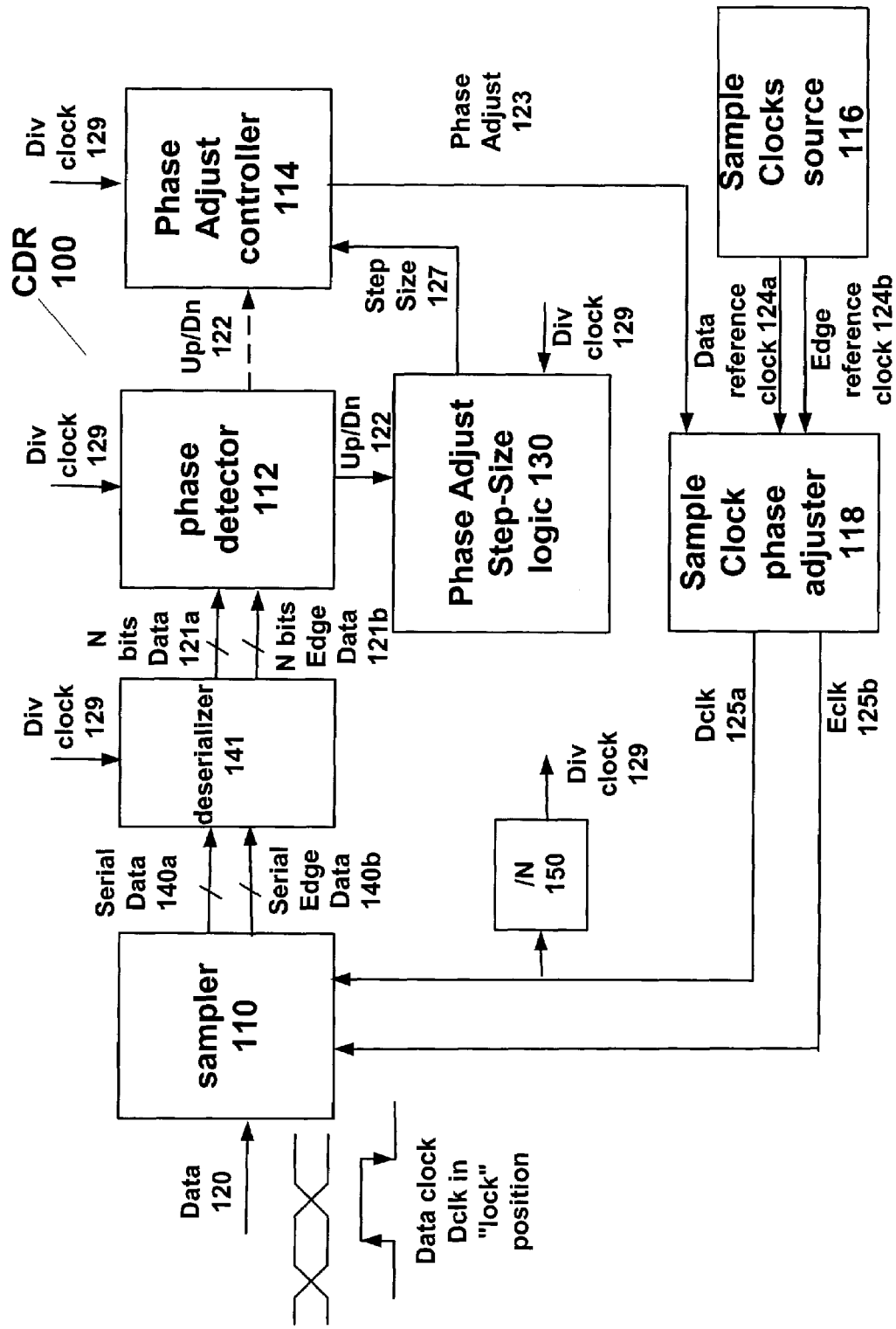
FIG. 1 is a block diagram illustrating a CDR circuit according to an embodiment of the present invention.

FIG. 1 illustrates a CDR circuit 100 having a Phase Adjust Step-Size logic 130 for determining a phase adjust step-size according to an embodiment of the present invention. CDR circuit 100 is able to track a Data signal 120 having a variable data bit-rate or variable frequency (also known as a spread spectrum). In an embodiment of the present invention, Data signal 120 has a bit-rate that has a fixed difference with respect to Dclk clock signal 125a. In another embodiment of the present invention, Data signal 120 has a data bit-rate that varies continuously in a range of data bit-rates with respect to Dclk clock signal 125a.

In an embodiment of the present invention, CDR circuit 100 is able to track a Data signal 120 varying from approximately 0 ppm to approximately 5000 ppm from a Dclk clock signal 125a. Embodiments of CDR circuit 100 and Phase Adjust Step-Size logic 130 are shown in FIGS. 5, 7, 8 and 10 and are described in detail below. Thus, as described herein, CDR circuit 100 is able to track an incoming Data signal 120 having a wide variation in date bit-rate or data phase drift (ppm) by adjusting a phase adjust step-size.

In an embodiment of the present invention, Phase Adjust Step-Size logic 130 based on ppm and the most recent Up/Dn signal 122 outputs a step size signal 127 indicating the magnitude and direction of a step size. In an embodiment of the present invention, Phase Adjust Step-Size logic 130 determines ppm of Data signal 120 with respect to Dclk 125a based on a plurality of Up/Dn signals received over a period of time.

For example, if Phase Adjust Step-Size logic 130 determines that ppm of Data signal 120 is much greater than zero and the latest Up/Dn signal is an Up signal, a Step-Size signal 127 indicating a zero change in magnitude and zero direction is output. If Phase Adjust Step-Size logic 130 determines that ppm of Data signal 120 is greater than zero and the latest Up/Dn signal is an Up signal, a Step-Size signal 127 indicating a 1 count magnitude and up direction is output. If Phase Adjust Step-Size logic 130 determines that ppm of Data signal 120 is zero and the latest Up/Dn signal is an Up signal, a Step-Size signal 127 indicating a 2 count magnitude and up direction is output. If Phase Adjust Step-Size logic 130 determines that ppm of Data signal 120 is less than zero and the latest Up/Dn signal is an Up signal, a Step-Size signal 127 indicating a 3 count magnitude and up direction is output. If Phase Adjust Step-Size logic 130 determines that ppm of Data signal 120 is much less than zero and the latest Up/Dn signal is an Up signal, a Step-Size signal 127 indicating a 4 count magnitude and up direction is output.

If Phase Adjust Step-Size logic 130 determines that ppm of Data signal 120 is much greater than zero and the latest Up/Dn signal is a Dn signal, a Step-Size signal 127 indicating a 4 count magnitude and down direction is output. If Phase Adjust Step-Size logic 130 determines that ppm of Data signal 120 is greater than zero and the latest Up/Dn signal is a Dn signal, a Step-Size signal 127 indicating a 3 count magnitude and down direction is output. If Phase Adjust Step-Size logic 130 determines that ppm of Data signal 120 is zero and the latest Up/Dn signal is an Dn signal, a Step-Size signal 127 indicating a 2 count magnitude and down direction is output. If Phase Adjust Step-Size logic 130 determines that ppm of Data signal 120 is less than zero and the latest Up/Dn signal is an Dn signal, a Step-Size signal 127 indicating a 1 count magnitude and down direction is output. If Phase Adjust Step-Size logic 130 determines that ppm of Data signal 120 is much less than zero and the latest Up/Dn signal is an down signal, a Step-Size signal 127 indicating a 0 count magnitude and down direction is output.

If Phase Adjust Step-Size logic 130 determines the latest Up/Dn signal is a no transition signal or no Up or Dn signal is received, a Step-Size signal 127 indicating a zero magnitude change and no change in direction regardless of the ppm of Data signal 120.

In an embodiment of the present invention, a 4 count change in magnitude equals 4 times the 1 count magnitude. Likewise, for the 3 and 2 count magnitude changes.

CDR circuit 100 includes a sampler 110 that receives a Data signal 120 in response to a Dclk clock signal 125*a* provided by Sample Clock phase adjuster 118. A deserializer 141 receives serial data 140*a* and serial edge data 140*b* from sampler 110 and outputs in a parallel format N bits of data 121*a* and N bits of Edge data 121*b* every update cycle to phase detector 112. The update rate is the rate or frequency at which the (phase adjust) Step-Size signal 127 is recalculated or regenerated. An update cycle is the period of time between recalculating or regenerating the outputs of the components (e.g., deserializer 141, phase detector 112, Phase Adjust controller 114, and Phase Adjust Step-Size logic 130) clocked by Div Clock 129. Phase detector 112 then uses N bits of data 121*a* and the last bit from the previous N-bit update cycle (for a total of N+1 bits of data) along with N bits of edge data 121*b* to produce outputs up, down, or no transition ("Up/Dn") signal 122 to a Phase Adjust Step-Size logic 130. In an alternate embodiment of the present invention, Up/Dn signal 122 is provided as a phase movement signal to Phase Adjuster controller 114.

In an embodiment of the present invention, sampler 110 includes multiple samplers or receive circuits.

In an embodiment of the present invention, a phase detector 112 includes a majority detector that takes the phase information from each of the N+1 bits of data and N bits of edge data. The N+1 bits of data determine if there is transition between each of the data bits and uses the corresponding N bits of edge data to determine if Dclk 125*a* and Eclk 125*b* are early or late relative to Data 120. The majority detector votes on each of transitions in the N+1 bits of data, using the N bits of edge data, to provide a single Up, Dn, or no transition signal. Phase adjuster 114 then generates a Phase Adjust signal 123, responsive to Up/Dn signal 122, to Sample Clock phase adjuster 118 in order to align a Dclk clock signal 125*a* with respect to a Data signal 120. Sample Clock phase adjuster 118 outputs a Dclk clock signal 125*a* to sampler 110 responsive to a Phase Adjust signal 123 and a Data reference clock signal 124*a* from Sample Clocks source 116. Sample Clock phase adjuster 118 outputs a Eclk clock signal 125*b* to sampler 110 responsive to a Phase Adjust signal 123 and a Edge reference clock signal 124*b* from Sample Clocks source 116.

In an embodiment of the present invention, Sample Clocks source 116 includes a phase lock loop circuit. In an embodiment of the present invention, Sample Clocks source 116 generates two clock signals: Data reference clock signal 124*a* and Edge reference clock signal 124*b*. In an embodiment of the present invention, both edges of Dclk 125*a* are used to time sampling of data values in Data signal 120. In an alternate embodiment of the present invention, four clock signals are output in a double data rate ("DDR") mode of operation. Complementary clock signals that are 180 degrees out of phase from Data reference clock 124*a* and Edge reference clock 124*b* are also respectively output from Sample Clocks source 116 in a DDR mode of operation. Similarly, corresponding clock signals are output from Sample Clock phase adjuster 118 in a DDR mode of operation. Dclk clock signal 125*a* and Eclk clock signal 125*b* are output from Sample Clock phase adjuster 118 to sampler 110. The Dclk clock signal 125*a* also inputs into Divide-by-N circuit 150. In an embodiment of the present invention, N equals the number of bits output in parallel format from deserializer 110*a*. In a double data rate operation embodiment, Dclk clock signal 125*a* is divided by N/2 by divide-by-N circuit 150 and input to sampler 110. For example, if 10 bits of data are output from deserializer 141, Divide-by-N circuit 150 would divide Dclk 125*a* by 10. If 10 bits of data were output from deserializer 141 in a DDR mode of operation, Divide-by-N circuit 150 would divide Dclk 125*a* by 5.

In an embodiment of the present invention, Divide-by-N circuit 150 generates a Div Clock signal 129 for timing circuit components of CDR 100. In particular, Div Clock signal 129 is input to deserializer 141, phase detector 112, Phase Adjuster controller 114 and Phase Adjust Step-Size logic 130.

Phase Adjust Step-Size logic 130 outputs a Step-Size signal 127 to Phase Adjust controller 114 in order to select the direction and/or the magnitude of the (phase adjust) step-size Phase Adjust signal 123 in an embodiment of the present invention. Step-size of Phase Adjust signal 123 is set as a number of bits of resolution as described below in various embodiments of the present invention. Phase Adjust Step-Size logic 130 may receive and/or output additional signals, some of which are described herein in various embodiments of the present invention. In an alternative embodiment of the present invention, Phase Adjust Step-Size logic 130 may be located within other circuit components of CDR circuit 100, such as Phase Adjust controller 114.

A step-size or resolution, including the direction of a Phase Adjust signal 123 is selected in response to Step-Size signal 127. Phase Adjuster controller 114 generates a Phase Adjust signal 123 in response to Step-Size signal 127. Phase Adjust signal 123 represents both the magnitude and the direction of the step-size change. In an embodiment of the present invention, the Step-Size signal 127 represents the phase adjustment needed (which may be expressed as an amount of time or a portion of a clock cycle) to shift clock signals 124*a-b* to produce Dclk clock signal 125*a* and Eclk clock signal 125*b*.

In an embodiment of the invention, the Phase Adjust signal 123 is expressed as a number of bits that represents a time or clock cycle portion.

An update rate is the rate at which CDR circuit 100 updates the Phase Adjust signal 123. An update rate is determined by the number of bits N output in parallel format by deserializer 141. In an embodiment of the present invention, the number of bits output by deserializer 141 is N and is selected during initialization or manufacture of CDR 100. In an alternate embodiment of the present invention, the number of bits N output from deserializer 141 is adjusted during operation of CDR 100. In this embodiment of the present invention, divide-by-N circuit 150 is adjusted to output Div Clock signal 129 correspond to the adjusted N parallel bits output from deserializer 141. For example, for an N-bit update rate, N bits of data 121a is transferred from deserializer 141 on N lines to phase detector 112 in order to determine a Phase Adjust signal 123 from Phase Adjuster controller 114 to Sample Clocks source 118.

CDR circuit 100 may also be described in terms of a number of pipeline stages. A pipeline stage is defined as a circuit component that processes data within a single update cycle. In an embodiment of the present invention, CDR circuit 100 includes 6 pipeline stages. Because the phase detector 112 illustrated in FIG. 1 may, in an embodiment of the invention, require 2 update cycles to generate Up/Dn 122, phase detector 112 may be described as a circuit component having two pipeline stages.

The maximum phase variation (expressed in terms of the parts per million (ppm), and which is sometimes referred to as maximum data phase drift or maximum tracking rate) that CDR circuit 100 is able to tolerate is equal to the ratio of the step-size to the update rate multiplied by the bit-time of data signal 120, as seen below in Equation ("Equ.") 1:

$$\text{ppm} = \text{step-size/update rate} * \text{bit-time} \quad \text{Equ. 1}$$

Figure 2:
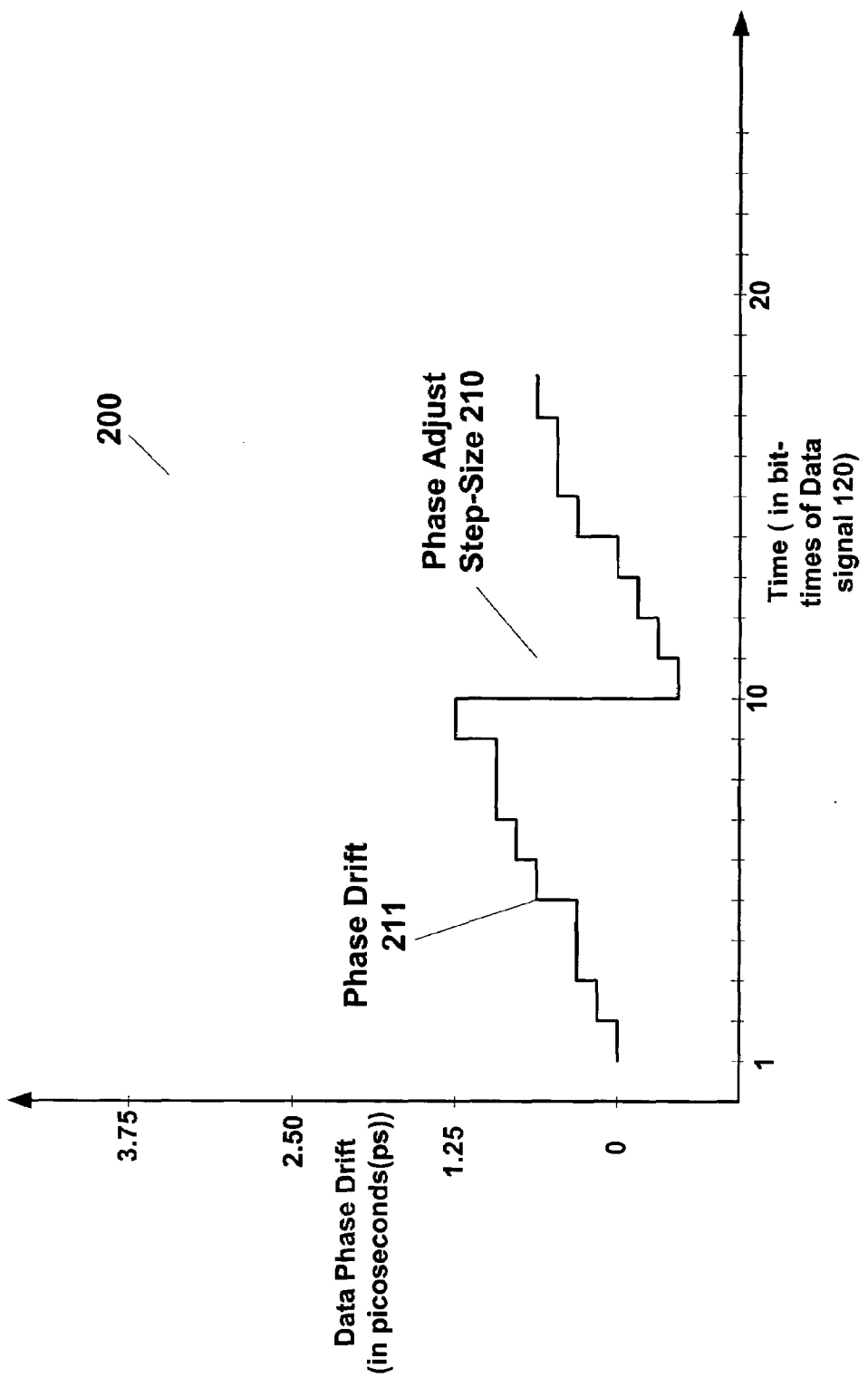
FIG. 2 is a diagram illustrating phase drift between a data signal and a clock signal recovered from the data signal using a CDR circuit, according to an embodiment of the present invention.

FIG. 2 shows a discrete data phase drift/adjust curve 200 illustrating Equ. 1. For example, if deserializer 141 outputs 10 bits per update cycle and if phase detector 112 observes at least one transition within that update cycle, phase adjuster controller 114 will generate a phase adjust signal 123 which will shift Data reference clock signal 124a by the phase adjust step-size 210 after data phase drift 211 has occurred. A phase adjust step-size 210 will have to be greater than the amount of phase drift 211 that occurs within those 10 bit-times or:

$$\text{step-size} \geq \text{update rate} * \text{ppm} * \text{bit-time} \quad \text{Equ. 2}$$

For example,
if Data signal 120 equals 4 Gbps with 500 ppm of drift;
Dclk clock signal 125a equaling 2 GHz (if DDR); and
a bit-time of Data signal 120 equals 250 ps (10 bit-times equal 2.5 ns);
amount of data drift ppm in 10 bit-times equal 1.25 ps.

In this example, a CDR circuit 100 may observe as much as 1.25 ps of phase drift in 10 bit-times. In order to overcome phase drift 211, a phase adjust step-size 210 has to be larger than 1.25 ps.

Thus, in order to increase the maximum tracking rate of CDR circuit 100 having a fixed bit-time of Data signal 120, a step-size and/or an update rate must be adjusted or selected for a data signal having a variable data bit-rate. Maximum tracking rate is the largest ppm variation in a Data signal 120 CDR circuit 100 can tolerate and still acquire or lock to.

Assuming 8-bits for the step-size for Phase Adjust signal 123, the step-size would be 1.95 ps for this example (500 ps(2×bit-time)/$2^{8}$=1.95). A 10-bit update rate and 8-bit step-size provides a maximum tracking rate for CDR circuit 100 of 780 ppm:

$$\text{ppm} = \text{step-size/update rate} * \text{bit-time} \quad \text{Equ. 3}$$
$$= 1.95 \text{ ps}/10 * 250 \text{ ps} = 780 \text{ ppm}$$

If Data signal 120 has a greater data bit-rate than 780 ppm, CDR circuit 100 will not be able to "catch up" and lock to Data signal 120 because the data phase drift will be greater than the phase adjust step-size or maximum tracking rate of CDR circuit 100. When a step-size of Phase Adjust signal 123 is increased to a 6-bit resolution (500 ps/$2^{6}$=7.81 ps) and an update rate is decreased to 5-bits, CDR circuit 100 has an increased maximum tracking rate of 6248 ppm, which is 8 times the maximum tracking rate of a CDR circuit 100 using 10-bit update rate and 8-bit step-size $$\text{ppm}_{\text{5-bit update/6-bit step-size}} = 7.81 \text{ ps}/5 * 250 \text{ ps} = 6248 \text{ ppm} \quad \text{Equ. 4}$$

Figure 3:
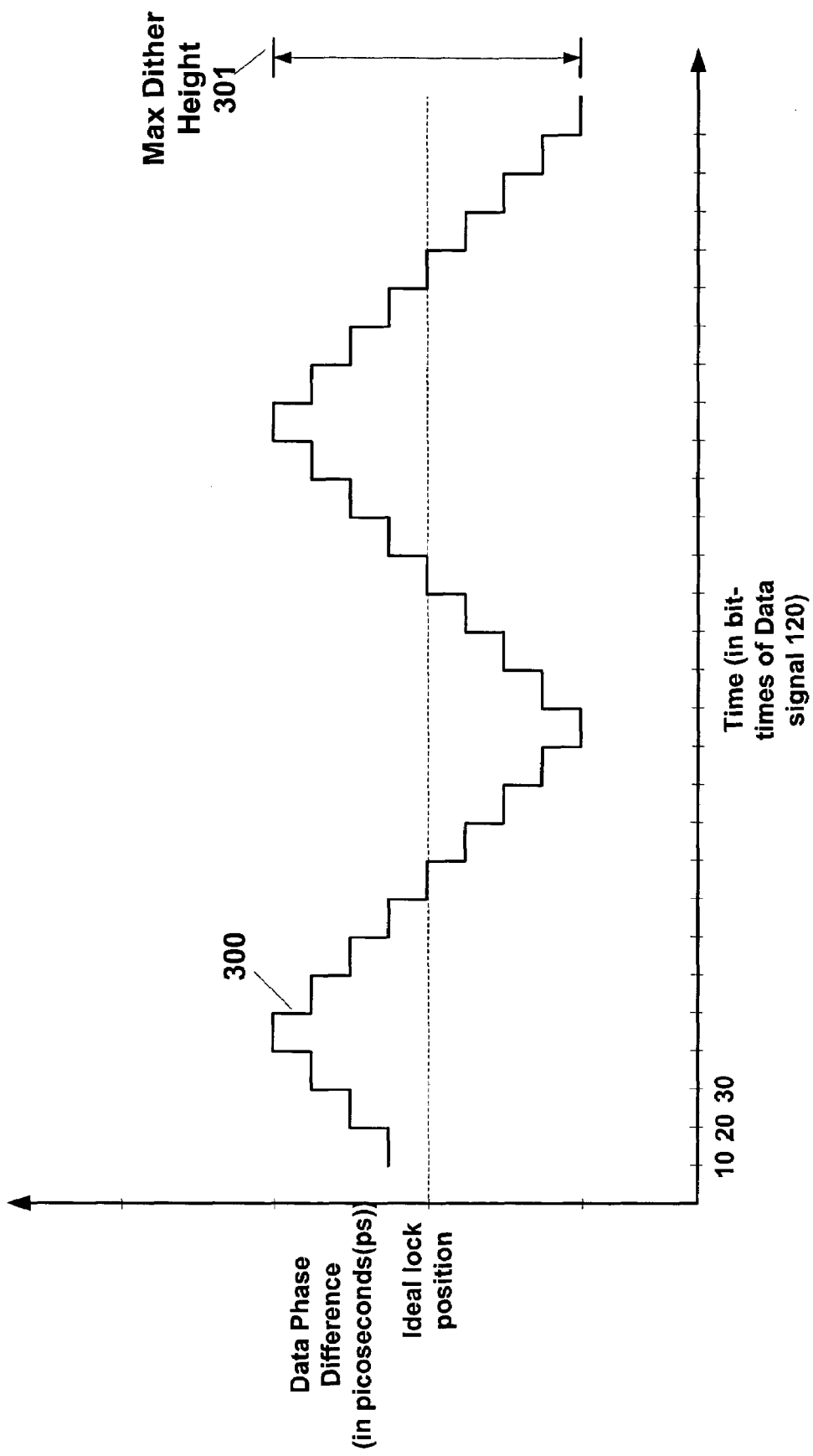
FIG. 3 is a diagram illustrating the dither height of a CDR circuit, according to an embodiment of the present invention.

However by increasing a phase adjust step-size, the dither associated with CDR circuit 100 is likewise increased. Dither is the amount of phase offset from a Dclk clock signal 125a to Data signal 120 from the ideal lock position when CDR circuit 100 is tracking Data signal 120. FIG. 3 illustrates a data phase drift/adjust curve 300 representing the amount of dither of CDR circuit 100 as a function of bit-time of Data signal 120 when there is no ppm difference between Data signal 120 and Dclk clock signal 125a. Maximum dither height 301 illustrates the maximum phase difference between Data signal 120 and Dclk clock signal 125a when CDR 100 is operating around the ideal lock position. The dither is a function of step-size and circuit latency.

In an embodiment of the invention, the update rate may be decreased if the CDR circuit 100 is capable of operating a higher frequency by increasing the frequency of Div clock signal 129. For example, in order to decrease the update rate from 10 bits of data to 5 bits of data, each pipeline stage of CDR circuit 100 would need to operate twice as fast.

Maximum ("Max") dither height, when Data signal 120 does not include a variable data bit-rate (ppm), may be expressed as a function of the number of pipeline stages in CDR circuit 100 and the step-size as seen in Equ. 5:

$$\text{Max dither height} = \pm(\text{pipeline stages} \times \text{step-size}) \quad \text{Equ. 5}$$

For example, a CDR circuit 100 having 6 pipeline stages and a 6-bit step-size has a relatively large maximum dither height, which may be expressed as a percentage of the bit-time of Data signal 120:

$$\text{Max dither height} = \pm(6 \times (2 \times \text{bit-time})/2^{6}) \quad \text{Equ. 6}$$
$$= \pm(0.1875 \times \text{bit-time})$$

In comparison, a CDR circuit 100 having 6 stages and an 8-bit step-size has a maximum dither height which is smaller, by a factor of 4, than the maximum dither height of an analogous CDR circuit 100 using a 6 bit step-size:

$$\text{Max dither} = \pm(0.047 \times \text{bit-time}) \quad \text{Equ. 7}$$

Figure 4:
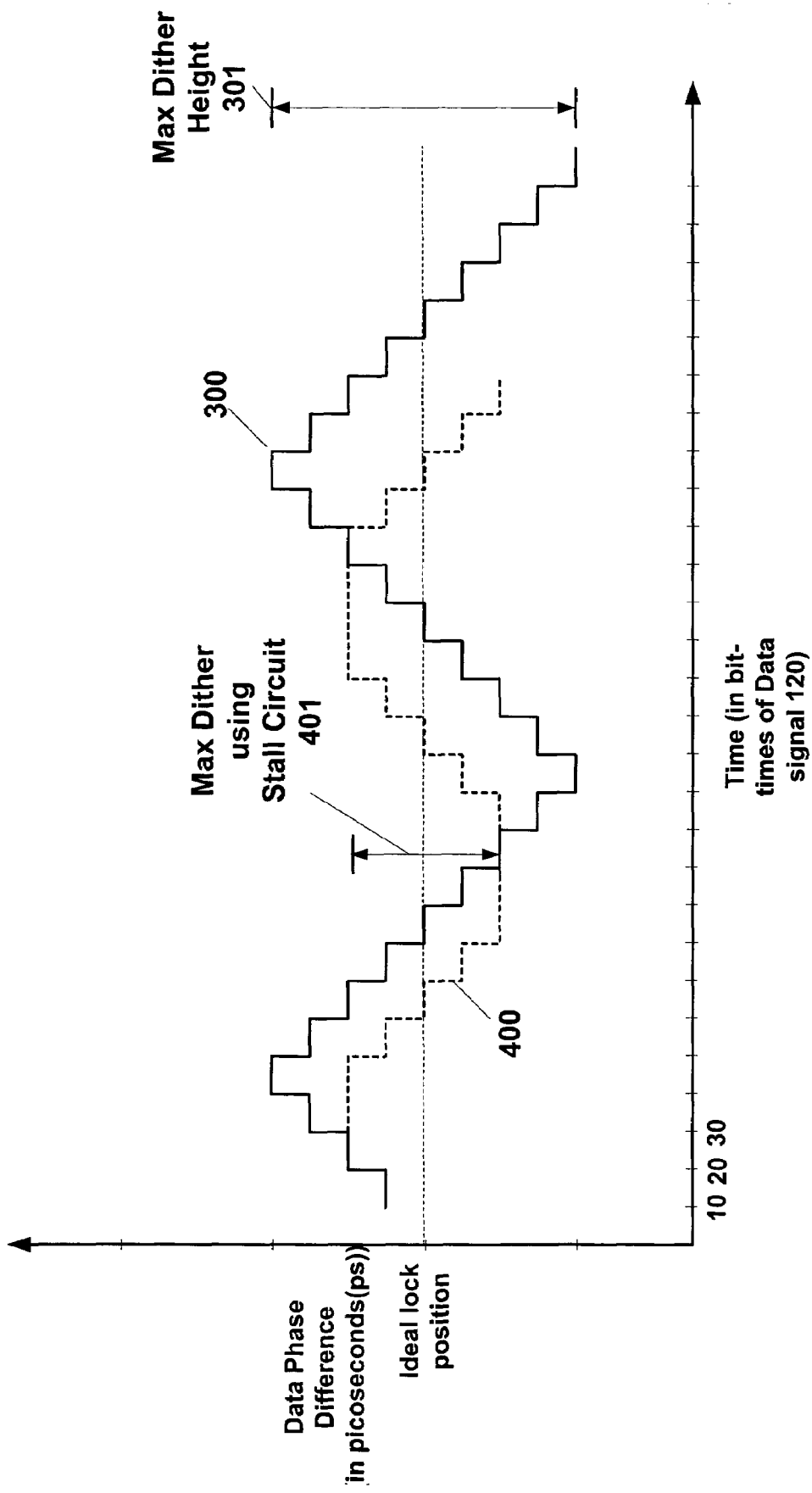
FIG. 4 is a diagram illustrating a reduced dither height when using a CDR circuit having a Stall circuit according to an embodiment of the present invention.
Figure 5:
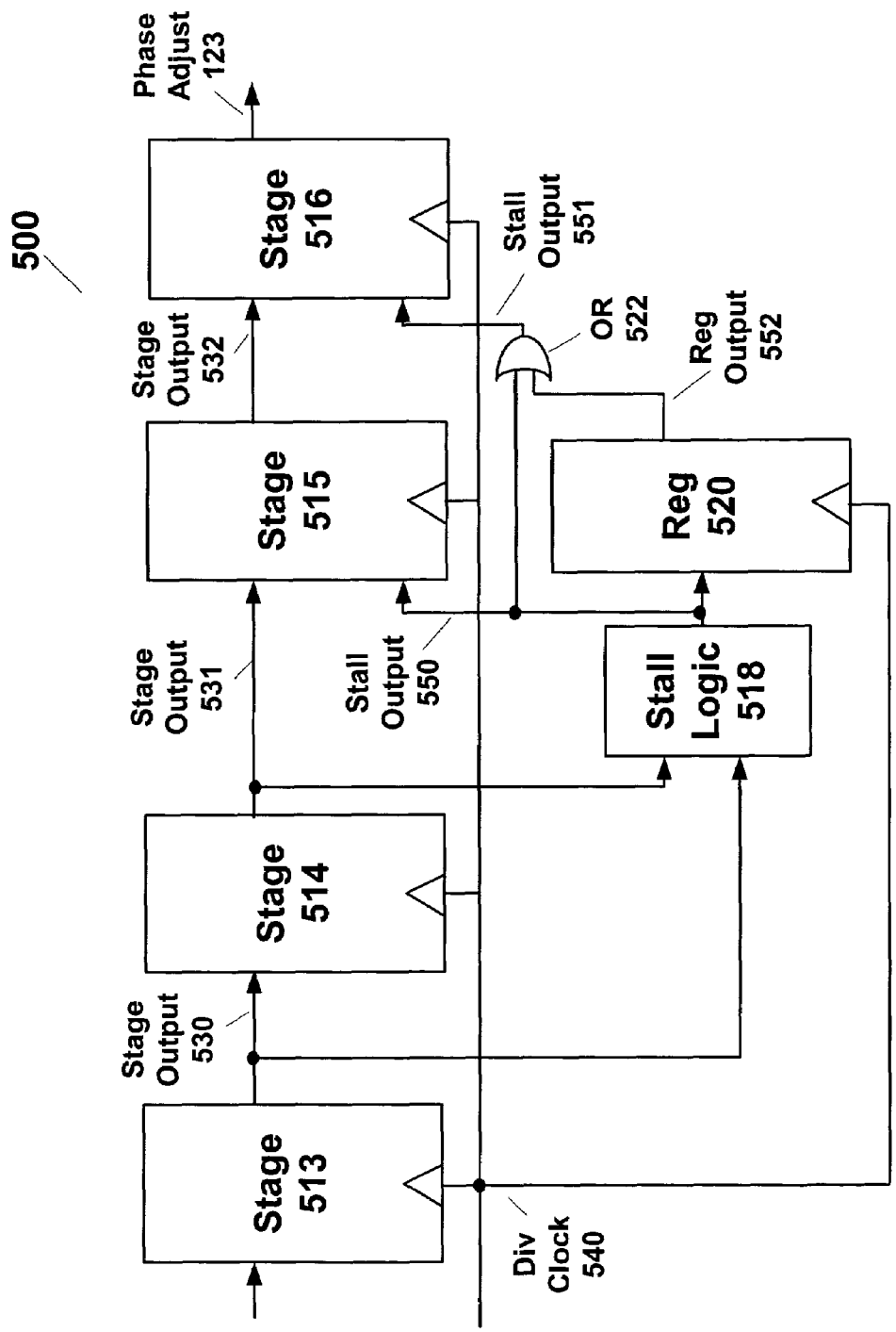
FIG. 5 is a block diagram illustrating a Stall circuit according to an embodiment of the present invention.

FIG. 5 illustrates Stall logic 500 along with components of CDR 100 seen in FIG. 1 represented as pipeline stages 513-16. For example, pipeline stages 513 and 514 represent phase detector 112 illustrated in FIG. 1. In an embodiment of the present invention, Stall circuit 500 shown in FIG. 5 is used to reduce maximum dither height 301 of phase drift curve 300 as seen in FIGS. 3 and 4. Selectively stalling or bypassing a few pipeline stages in CDR circuit 100 reduces maximum dither height 301. Stall circuit 500 looks ahead at up/down signals from a phase detector 112 and holds or latches an Up/Dn signal 122 if Stall logic 518 determines that an up to down or down to up transition is requested by consecutive stages by comparing two previous adjacent stage outputs in CDR circuit 100.

FIG. 5 illustrates a Stall circuit 500 along with 4 of 6 pipeline stages in CDR circuit 100 in an embodiment of the present invention. In an embodiment of the present invention, Stall circuit 500 includes Stall logic 518, register ("Reg") 520 and OR gate 522 that are coupled to the various pipeline stages. Stage 513 outputs a Stage Output signal 530 to stage 514 that likewise outputs a Stage Output signal 531. Stage 515 outputs a Stage Output signal 532 responsive to an inputted Stage Output signal 531. Stage 516 outputs a Phase Adjust signal 123 responsive to an inputted Stage Output signal 532. Stages 513-516 and Reg 520 are timed by a Div Clock signal 540. Stage Output signals 530 and 531 are input to Stall logic 518 which outputs a Stall Output signal 550 to stage 515, Register 520 and OR gate 522. Register 520 outputs a Register Output signal 552 to OR gate 522. OR gate 522 outputs Stall Output signal 551 to stage 516 responsive to Stall Output signal 550 and Register Output signal 552. Accordingly, Stall logic 518 outputs Stall Output signal 550 to stall or hold Stage Output signal 532 and Phase Adjust signal 123 of stages 515 and 516, respectively, for an update cycle, by looking ahead at Stage Output signals 530 and 531. Likewise, Stall Output signal 551 stalls or holds Phase Adjust signal 123 an additional update cycle.

For example, after comparing up/down signals in Stage Output signals 530 and 531, respectively, the last two stages of CDR circuit 100 may be stalled (stages 515 and 516). In other words, if Stall logic 518 detects an Up signal from stage 513, such as a phase detector 112, and stages 514, 515 and 516 are outputting Down signals, by comparing outputs from stages 513 and 514 for a change in the direction of tracking (an up to down or a down to up transition), stages 515 and 516 can be stalled to reduce the maximum dither height 301.

FIG. 4 illustrates reducing maximum dither height when using Stall circuit 500. Data phase difference curve 300 illustrates a maximum dither height 301 when not using Stall circuit 500. In comparison, data phase difference curve 400 illustrates a significantly reduced maximum dither height 301 when using Stall circuit 500. Thus, a CDR circuit 100 with a 6-bit step-size and having 6 stages in which 2 stages may be stalled is equivalent to a CDR circuit having 4 stages with a reduced maximum dither height as seen in Equ. 8:

$$\text{Max dither height} = \pm(4 \times (2 \times \text{bit-time})/2^6) \qquad \text{Equ. 8}$$
$$= \pm(0.125 \times \text{bit-time})$$

Figure 6:
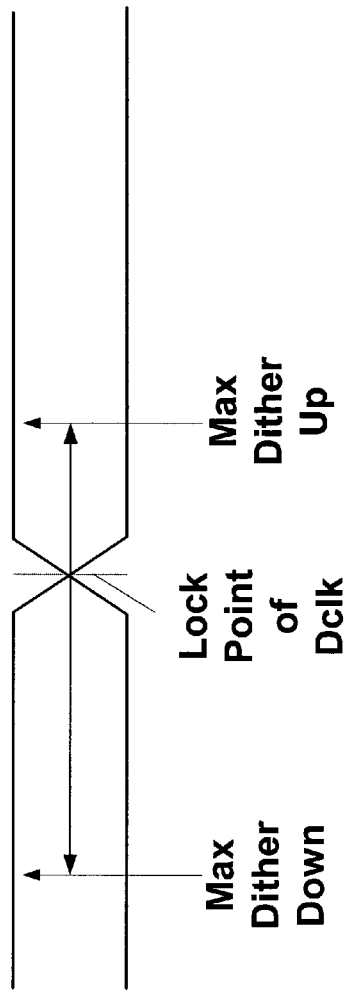
FIG. 6 illustrates maximum dither up and maximum dither down according to an embodiment of the present invention.

Decreasing the maximum dither height, as described above, does not take into account a variable data bit-rate (ppm) in Data signal 120. When a variable data bit-rate is present in Data signal 120, maximum dither height decreases in the direction a Dclk clock signal 124a tracks to data phase drift (i.e. "catch-up") per update rate, but increases (adds to step-size) the dither away from the direction of Dclk clock signal 124a versus data phase drift. FIG. 6 and Equations 9 and 10 illustrate this relationship:

$$\text{max dither up} = \text{\# pipeline stages} \times (\text{step-size} - \text{data phase drift}) \qquad \text{Equ. 9}$$

$$\text{max dither down} = \text{\# pipeline stages} \times (\text{step-size} + \text{draft phase drift}) \qquad \text{Equ. 10}$$

For example, a CDR circuit 100 having a 5-bit update rate, 6 pipeline stages and a 6-bit step-size has the following maximum dither up and down values:

$$\text{max dither up} = 6 \times ((2 \times \text{bit-time})/2^6) - 5 \times \text{ppm} \times \text{bit-time}) \qquad \text{Equ. 11}$$
$$= 6 \times (1/2^5 - 5 \times \text{ppm}) \times \text{bit-time}$$

$$\text{max dither down} = 6 \times ((2 \times \text{bit-time})/2^6) - 5 \times \text{ppm} \times \text{bit-time}) \qquad \text{Equ. 12}$$
$$= 6 \times (1/2^5 + 5 \times \text{ppm}) \times \text{bit-time}$$

with ppm=5000:
max dither up=0.0375×bit-time
max dither down=0.3375×bit-time.

Thus, maximum dither down is an order of magnitude larger than maximum dither up.

Even if Stall circuit 500 were used, a CDR circuit 100 would not be able to track Data signal 120 having certain variable data bit-rates without additional correction or step-size correction based on the data bit-rate of Data signal 120. As can be seen by Equation 13, maximum dither down, using an effective 4 stage CDR circuit, is still a relatively large percentage of bit-time:

$$\text{max dither down} = 4 \times ((2 \times \text{bit-time})/2^6) + 6(5 \times \text{ppm} \times \text{bit-time}) \qquad \text{Equ. 13}$$
$$= 0.275 \times \text{bit-time}$$

Figure 7:
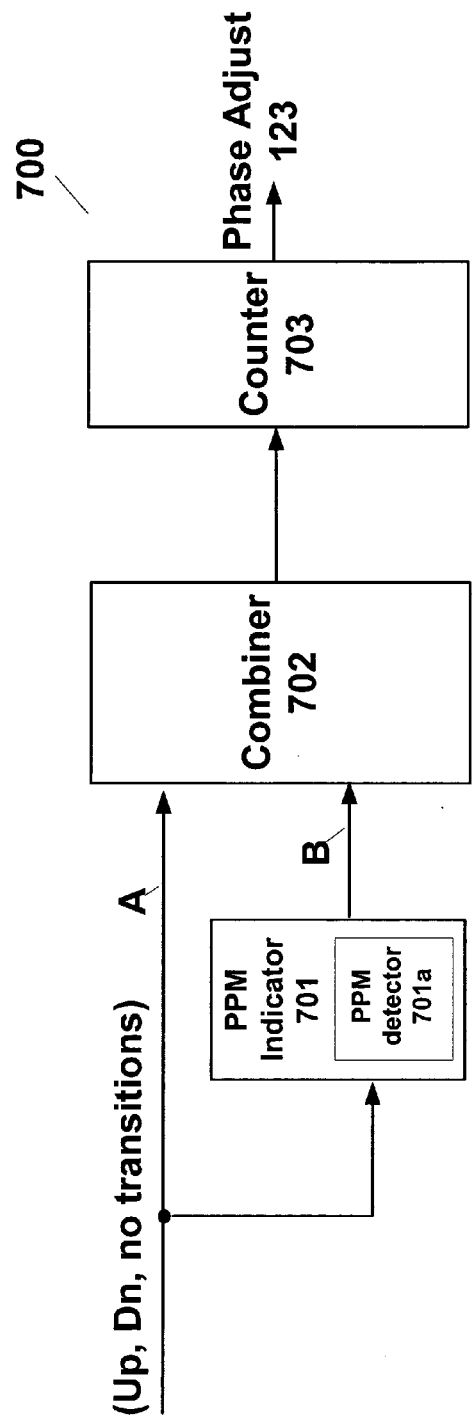
FIG. 7 illustrates a PPM indicator and counter/adder according to an embodiment of the present invention.

In an embodiment of the present invention, the PPM indicator 701, as illustrated in FIG. 7, may be included in Phase Adjust Step-Size logic 130, and Step Size combiner 702 and counter 703 may be included in Phase Adjuster controller 114 and the two may be used to adjust the step-size of Phase adjust signal 123 responsive to phase error and an amount of data phase drift. Circuit 700 uses both phase error and data phase drift to provide a phase adjust step-size of Phase Adjust signal 123. Circuit 700 includes a data phase drift or ("Parts Per Million") PPM indicator 701, Step Size combiner 702 and counter 703. PPM indicator 701 receives a signal A that includes phase error, in the form of Up/Dn signal 122 or no transitions. Step Size combiner 702 likewise receives signal A and sets a predetermined phase adjust step-size$_{up/dn}$ responsive to the Up/Dn signal 122.

In an embodiment of the present invention, Up/Dn signal 122 is input to PPM indicator 701 which detects a data drift of Data signal 120 and outputs a signal B that represent a variable phase adjust step-size$_{ppm}$ associated with a measured data phase drift of Data signal 120. Variable phase adjust step-size$_{ppm}$ represents a variable step-size based on the ppm drift between Data signal 120 and Dclk 124a. In an embodiment of the present invention, signal A corresponds to Up/Dn signal 122 (dashed line) or phase movement signal from phase detector 112 to Phase Adjust controller 114; and signal B corresponds to Step-Size signal 127 shown in FIG. 1.

In an embodiment of the present invention, counter 703 outputs a Phase Adjust signal 123 having a phase adjust step-size responsive to a previous count value Count [n], signal A or a predetermined step-size (step-size$_{up/dn}$) and signal B or a variable step-size (step-size$_{ppm}$) as seen below in Equation 14.

$$\text{Phase Adjust} = \text{Count}[n+1] = \text{Count}[n] + \text{step-size}_{up/dn} + \text{step-size}_{ppm} \quad \text{Equ. 14}$$

In an embodiment of the present invention, circuit 700 includes an 8-bit counter 703 and is included in a CDR circuit 100 having a 5-bit update rate, 6 stages and receives a 4 Gbps Data signal 120. Accordingly, a nominal count value from counter 703 without taking into account ppm is 1.95 ps:

$$\text{count value} = 2 \times 150 \text{ ps}/2^8 = 1.95 \text{ ps} \quad \text{Equ. 15}$$

So for every up/dn on signal A, Step-Size combiner 702 sets the following step-size$_{up/dn}$ as seen below in Equ. 16:

set step-size$_{up/dn}$ (A): up=+3.9 ps(2 cnts)

$$\text{dn} = -3.9 \text{ ps}(-2 \text{ cnts}) \quad \text{Equ. 16}$$

PPM Indicator 701 outputs a B signal, including a step-size$_{ppm}$, depending upon a detected data phase drift of Data signal 120. Table I below illustrates using a range of data phase drift or frequency differences to select a corresponding step-size$_{ppm}$ that is output from PPM indicator 701. For example, if PPM indicator 701 detects a phase drift difference of greater than 2600 ppm, a step-size$_{ppm}$ of 3.9 ps is output as signal B. Step-Size combiner 702 then sums or subtracts the values of signal A and B depending on Data signal 120's ppm with respect to Dclk 125a and whether CDR circuit 100 needs to "catch-up." For example, if PPM indicator 701 detects a high ppm of Data signal 120, combiner 702 sums a 3.9 ps step-size$_{ppm}$ and the 3.9 step-size$_{up/dn}$ to have a phase adjust step size to of 7.8 ps (4 cnts) to "catch-up" to the data and combiner subtracts the 3.9 ps step-size$_{ppm}$ and the 3.9 step-size$_{up/dn}$ to have a phase adjust step-size of 0 ps (0 cnts) if CDR circuit 100 wants to move sample clock signal Dclk clock signal 125a against a drift of the data. The summed or differenced step-size, as seen in the third and fourth columns of Table I, is then output from combiner 702 to counter 703 that adds a previously stored count value Count[n] to the summed or subtracted step-size to output Phase Adjust signal 123.

TABLE I

| Frequency difference | step-size$_{ppm}$ (B) | step-size B + A | step-size B − A |
|---|---|---|---|
| >\|2600 ppm\| | 3.9 ps (2 cnts) | 7.8 ps | 0 ps |
| >\|1300 ppm\| | 1.95 ps (1 cnts) | 5.85 ps | −1.95 ps |
| 0 ppm | 0 ps (0 cnt) | 3.9 ps | −3.9 ps |

For example, if Data signal 120 includes a data phase drift of 5000 ppm (5 bits×0.005 (ppm)×250 ps=6.25 ps every 5 bits), PPM indicator 701 outputs a 3.9 ps step-size$_{ppm}$ and Phase Adjust signal 123 includes the following step-sizes as well as maximum dither up/down values:

$$\begin{aligned}
&\text{phase adjust up step-size} = 7.8 \text{ ps} \\
&\text{phase adjust dn step-size} = 0 \text{ ps} \\
&\text{max dither up} = 6 \times (\text{up step-size} - \text{data drift}) \\
&\qquad = 6 \times (7.8 \text{ ps} - 6.25 \text{ ps}) \\
&\qquad = 9.3 \text{ ps}
\end{aligned} \quad \text{Equ. 17}$$

$$\begin{aligned}
\text{max dither dn} &= 6 \times (\text{down step-size} - \text{data drift}) \\
&= 6 \times (0 + 6.25 \text{ ps}) \\
&= 37.5 \text{ ps}
\end{aligned} \quad \text{Equ. 18}$$

In a maximum dither Dn case, combiner 702 and counter 703 is not used (0 step-size) and data is allowed to drift past a lock point or value.

Figure 8:
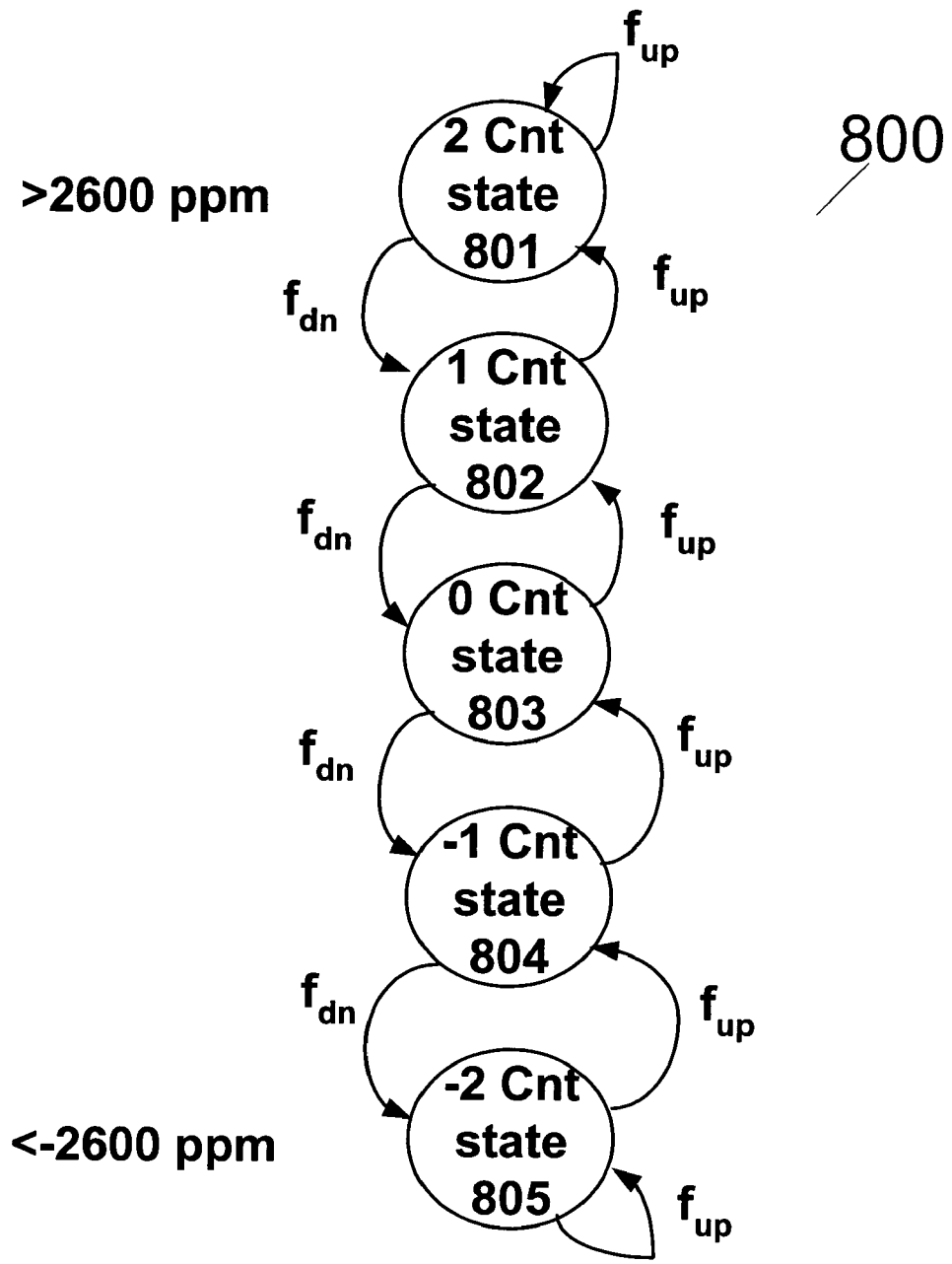
FIG. 8 is a state machine diagram for an indicator according to an embodiment of the present invention.

FIG. 8 illustrates a state machine 800 used in PPM indicator 701 to adjust the appropriate step-size$_{ppm}$ in an embodiment of the present invention. State machine 800 includes 5 states 801-805 to increment or decrement a step-size$_{ppm}$. $f_{up}$ represents a state transition toward addition of a step-size$_{ppm}$; while $f_{dn}$ represents a state transition toward subtraction of step-size$_{ppm}$. These state transitions require a frequency detector, such as PPM detector 701a, included in PPM indicator 701 to generate these step-size transitions in an embodiment of the present invention.

PPM indicator 701, and in particular a PPM detector 701a, triggers changes in states based on whether Data signal 120 includes a high or low amount data drift. In an embodiment of the present invention, the number of up and down signals from a phase detector 112 is used by PPM detector 701a to determine data drift. If the difference between up and down signals is relatively large, this indicates a high data drift in Data signal 120 because more steps in one direction is needed to "catch-up" to the drifting data.

For example, if PPM indicator 701 is in state 803 or a 0 cnt state, a phase adjust step-size is set to +3.9 ps and −3.9 ps for up and down signals, respectively.

In this example with 6 pipeline or latency stages, the number of up and down signals is then 42 and 8, respectively, as seen in Equs. 19 and 20:

$$\begin{aligned}\text{\# of ups} &= \\ &\quad 6 + 6 \times ((\text{down step-size} + \text{data drift})/(\text{up step-size} - \text{data drift})) \\ &= 6 + 6 \times ((3.9 + 6.25)/(|\,3.9 - 6.25\,|)) \\ &= 6 + 26 = 42\end{aligned}$$ Equ. 19

$$\begin{aligned}\text{\# of dns} &= 6 + 6 \times ((\text{up step-size} - \text{data drift})/(\text{up step-size} + \text{data drift})) \\ &= 6 + 2 = 8\end{aligned}$$ Equ. 20

Figure 9:
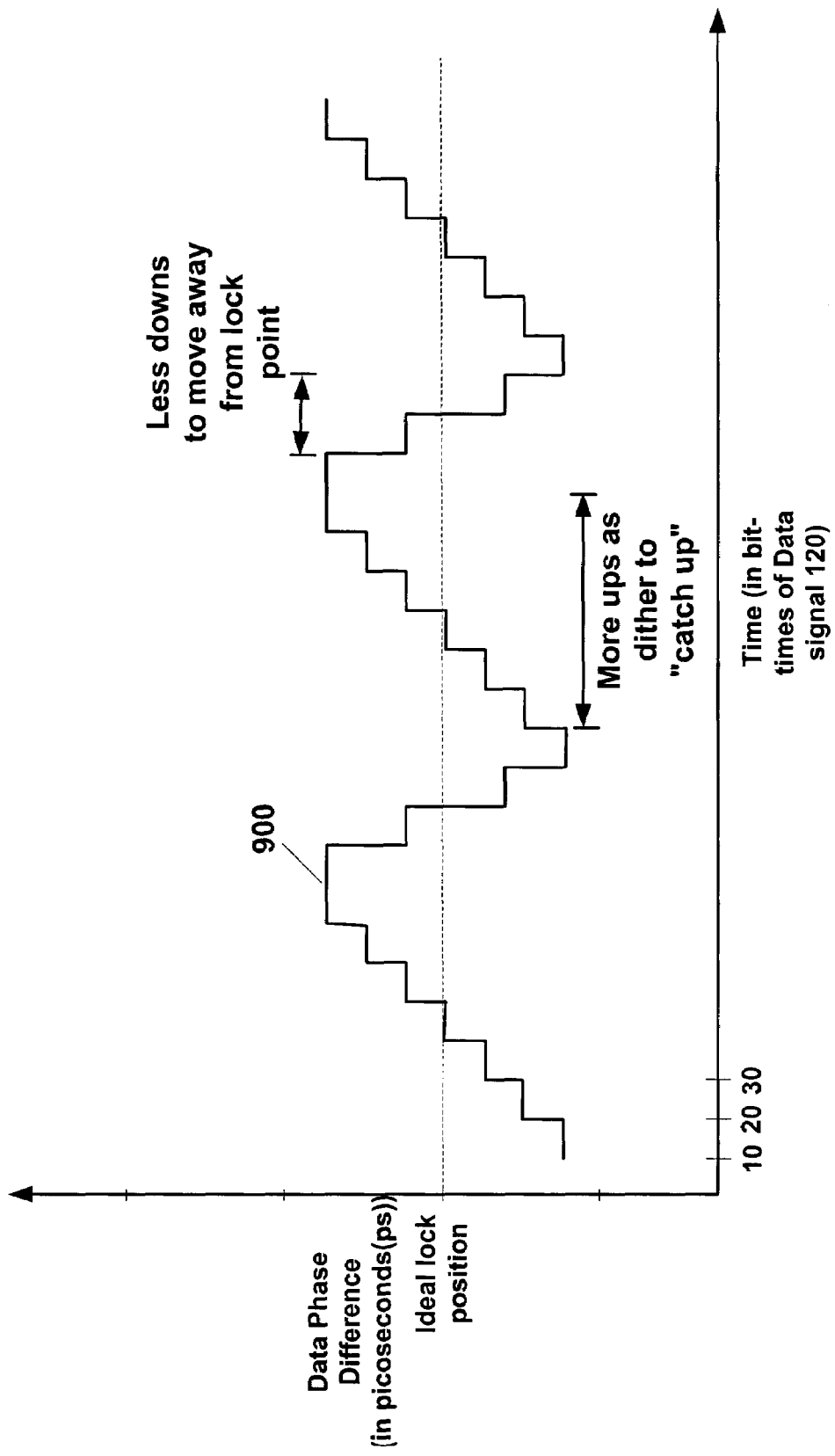
FIG. 9 illustrates when the number of up signals out number the number of down signals for a variable data bit-rate signal having a high ppm according to an embodiment of the present invention.

The number of up signals will outnumber the number of down signals when a Data signal 120 has high data drift away from up, because more ups will be needed to "catch up" to the data as the sample clock dithers about a lock position. FIG. 9 illustrates curve 900 showing more up signals are used to "catch up" to a lock phase value, or point, than down signals.

In an embodiment of the present invention, PPM detector 701*a* counts the number of up signals and the number of down signals for a predetermined period of time. PPM detector 701*a* then subtracts the number of up signals from the number of down signals to obtain an up/dn difference value. PPM detector 701*a* also stores a threshold value for determining whether PPM indicator 701 will change state. The up/dn difference value is then compared to the PPM detector threshold value in order to determine whether PPM indicator 701 should transition to a new state. For the example described above, if an up/dn difference value is greater than a threshold value of 15 for 40 updates, PPM indicator 701 would transition to a new state.

In an embodiment of the present invention, Stall circuit 500 shown in FIG. 5 is combined with PPM indicator 701 and counter/adder 702 shown in FIG. 7.

Figure 10:
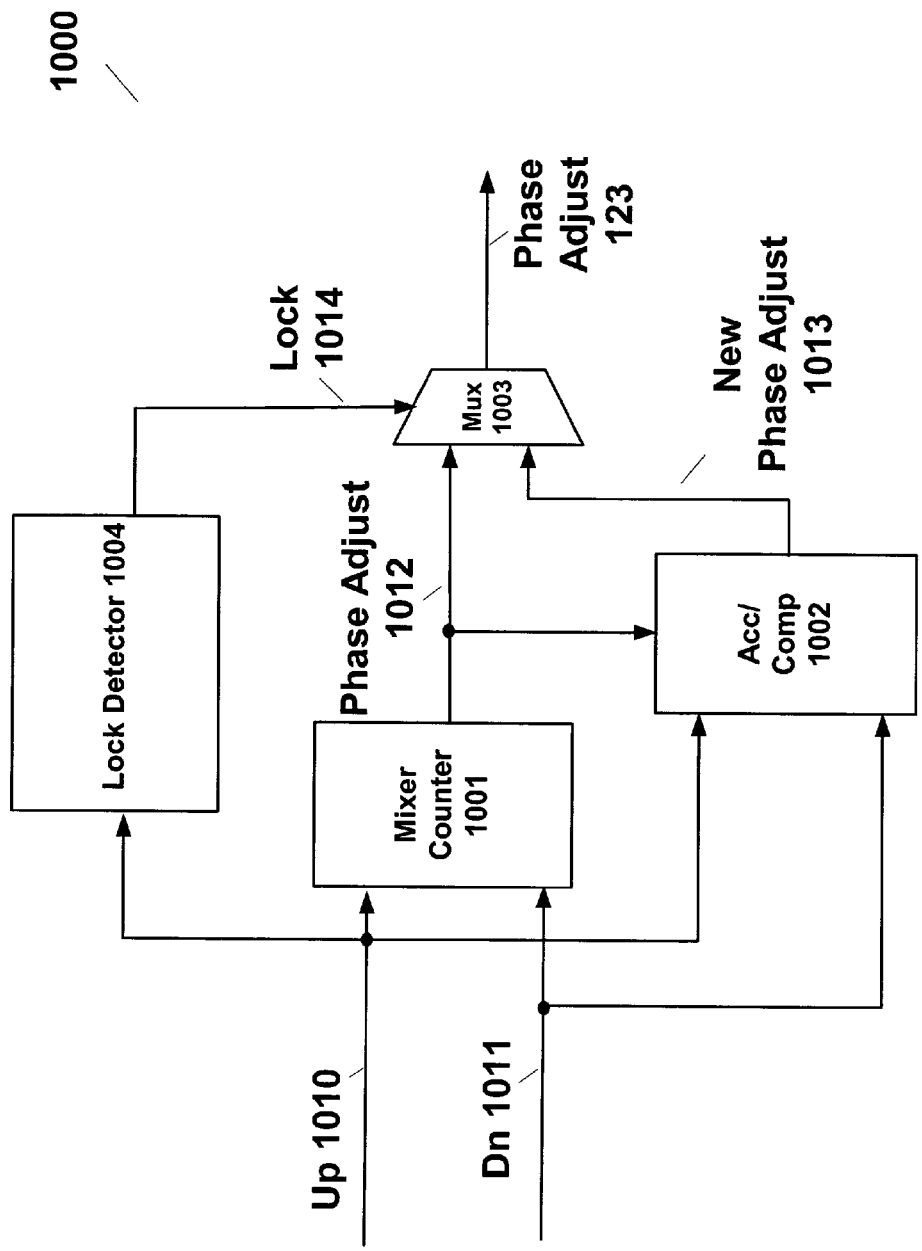
FIG. 10 illustrates an Averaging circuit according to an embodiment of the present invention.

FIG. 10 illustrates an Averaging circuit 1000 to reduce dither in a mesochronous apparatus according to an embodiment of the present invention. In an embodiment of the present invention, Averaging circuit 1000 is included in Phase Adjuster controller 114 of CDR circuit 100 shown in FIG. 1 and Data signal 120 does not have a variable data bit-rate. Averaging circuit 1000 outputs a Phase Adjust signal 123 having an adjusted phase adjust step-size by averaging and comparing Up/Dn signal 122.

An Up/Dn signal 122, shown as Up signals 1010 and Down signals 1011 in FIG. 10, are input to both mixer counter 1001 and accumulator ("Acc"")/comparator ("Comp") 1002. Mixer counter 1001 outputs a Phase Adjust signal 1012 having a first step-size or count value responsive to Up signals 1010 and Down signals 1011. Phase Adjust signal 1012 is input to multiplexer 1003 and Acc/Comp 1002.

Acc/Comp 1002 averages the number of Up signals to obtain an average up value for a predetermined period of time. Likewise, Acc/Comp 1002 also averages the number of Dn signals to obtain an average down value for a predetermined period of time. In an embodiment of the present invention, the predetermined period of time is 64 update cycles. Acc/Comp 1002 then compares the average up value to the average down value. If the average up value is greater than the average down value, Acc/Comp 1002 increases a stored Phase Adjust signal 1012 a step-size or count value and outputs Phase Adjust signal 1013 having an increased step-size to multiplexer 1003. If the average up value is not greater than the average down value, Acc/Comp 1002 decrements a saved Phase Adjust signal 1012 by a step-size or count value and outputs Phase Adjust signal 1013 to multiplexer 1003. Phase Adjust signal 123, as seen in FIG. 1, is output from multiplexer 1003 responsive to a Lock signal 1014. Lock signal 1014 is generated from a CDR lock detector 1004 that indicates Dclk clock signal 125*a* has locked to the Data signal 120. Lock signal 1014 is used to speed up the phase adjustment process by bypassing the Acc/Comp 1002. If CDR circuit 100 is tracking or locked to Data signal 120, a Lock signal 1014 is asserted and Phase Adjust signal 1013 selected as an output of multiplexer 1003; otherwise, Phase Adjust signal 1012 is selected as an output of multiplexer 1003.

Figure 11:
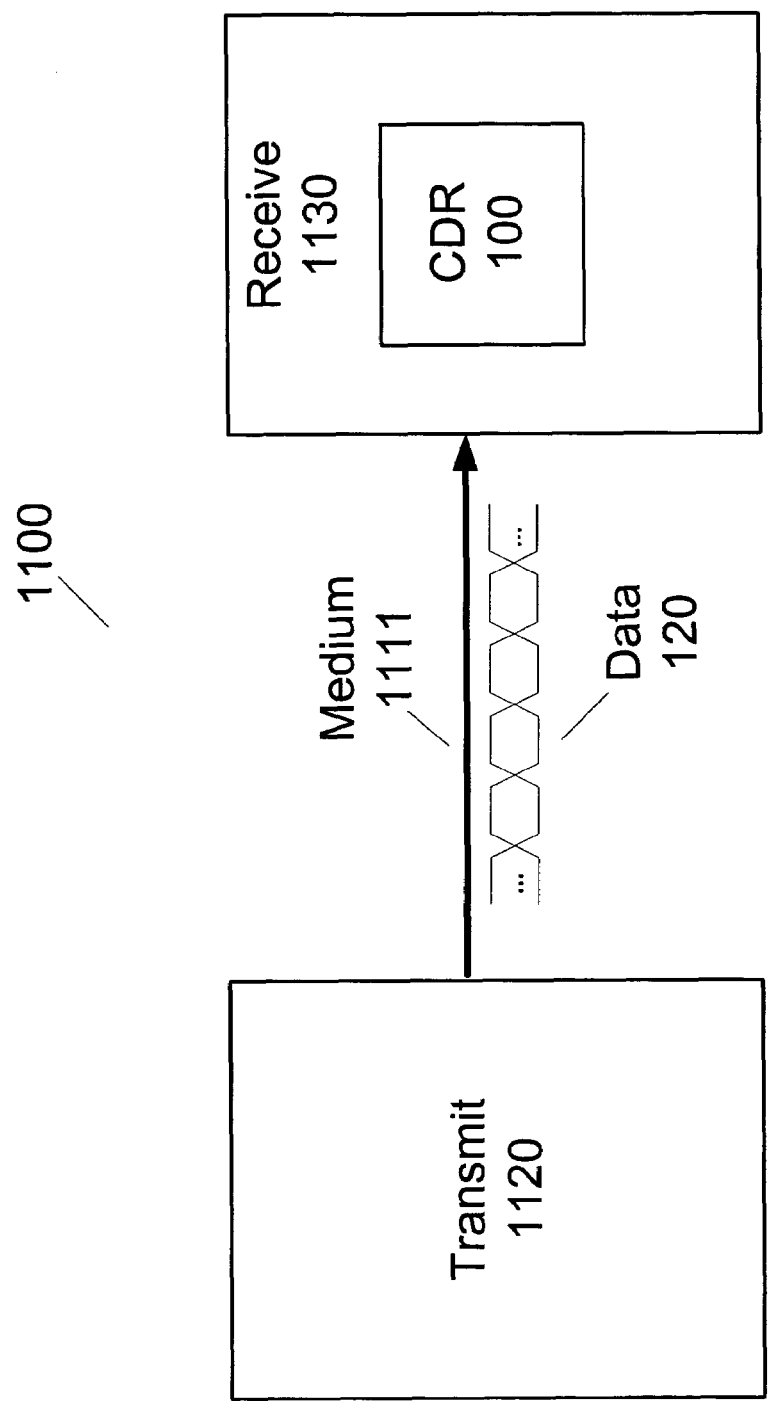
FIG. 11 illustrates an apparatus according to an embodiment of the present invention.

FIG. 11 illustrates a Communication apparatus 1100, such as a serial data system, according to an embodiment of the present invention. In an embodiment of the present invention, Communication apparatus 1100 includes a Transmit circuit 1120 and a Receive circuit 1130 coupled by medium 1111. In an embodiment of the present invention, Transmit circuit 1120 generates Data signal 120 on medium 1111 to Receive circuit 1130. Receive circuit 1130 includes a CDR circuit 100, according to embodiments of the present invention, that actively looks for transitions in the incoming Data signal 120 and phase aligns Dclk clock signal 125*a* with respect to the incoming Data signal 120 having a variable data bit-rate to provide optimal setup/hold margin times.

In an embodiment of the present invention, medium 1111 is a wire or set of wires for transporting signals. In an embodiment of the present invention, medium 1111 is a bidirectional data bus that may carry data information, control information or both. In an alternate embodiment of the present invention, medium 1111 is a unidirectional bus.

Figure 12:
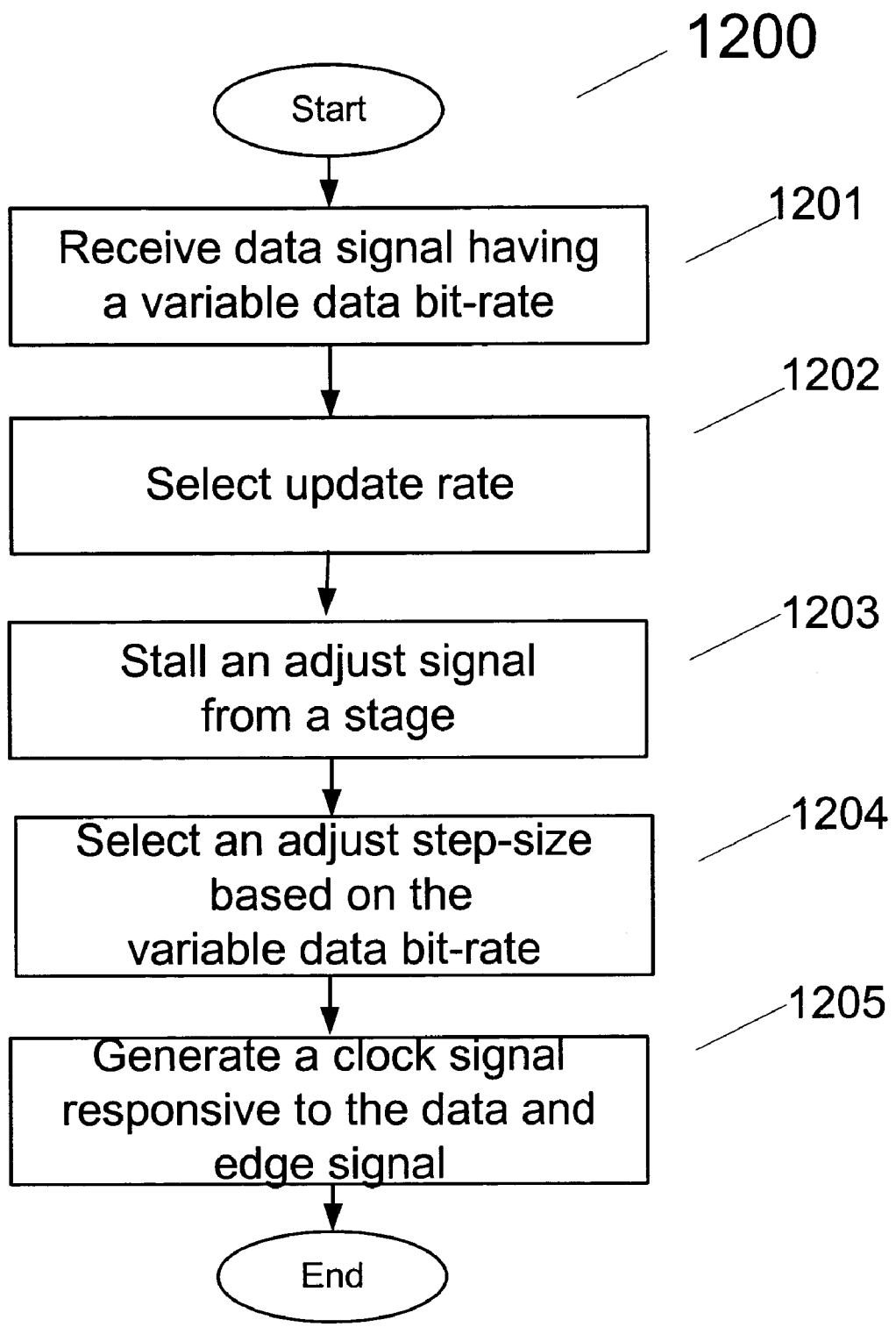
FIG. 12 illustrates a method according to an embodiment of the present invention.

FIG. 12 illustrates a method 1200 according to an embodiment of the present invention. In alternate embodiments of the present invention, steps illustrated as logic blocks shown in FIG. 12 are carried out by hardware, software or a combination thereof. In alternate embodiments, the steps illustrated in FIG. 12 are carried out by the components illustrated in FIGS. 1, 5, 7, 8, 10 and 11. As one of ordinary skill in the art would appreciate, other steps that are not shown may be included and steps shown may be removed in various embodiments of the present invention.

Method 1200 begins at logic block 1201 where a data signal having a variable data bit-rate is received. In an embodiment of the present invention, sampler 110 receives and samples a data signal. An update rate is selected as shown by logic block 1202. An adjust signal for adjusting the clock signal is provided and stalled as shown by logic block 1203. In an embodiment of the present invention, the adjust signal is used for multiple stages. A step-size for the adjust signal is then selected in response to the variable data bit-rate signal as illustrated by logic block 1204. In an embodiment of the present invention, the step-size is selected every cycle time. A clock signal is then generated to time the acquisition of data and edge values responsive to the data and edge signal and a clock source as shown in logic block 1205. Method 1200 then ends.

In various embodiments of the present invention, signals illustrated in the Figures and described herein are transferred between the circuits or electrical components by a single or multiple conductive elements, such as a metal wire or trace.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit, comprising:
a clock circuit capable of generating a clock signal having a phase, the clock circuit including a phase adjuster capable of making an adjustment to the phase of the clock signal during each of a plurality of adjustment cycles in response to an adjustable phase step-size;
a sampler, coupled to the clock circuit, capable of receiving, in response to the clock signal, a data signal having a variable data bit-rate by outputting sampled data bits as received data signal; and
wherein the circuit further includes phase detection and logic circuitry capable of stalling adjustment of the phase of the clock signal during one or more current adjustment cycles in response to data phase information derived from a plurality of data bits during one or more previous adjustment cycles,
wherein the circuit further includes a phase adjust step-size logic capable of outputting the adjustable phase step-size having an adjustable magnitude dependent on the variable data bit-rate.

2. The circuit of claim 1, wherein the phase adjust step-size logic is capable of outputting the adjustable phase step-size having a direction dependent on the variable data bit-rate.

3. The circuit of claim 1, wherein the circuit comprises 6 pipeline stages.

4. The circuit of claim 1, wherein the variable data bit-rate is from approximately 0 parts per million ("ppm") to approximately 5000 ppm.

5. The circuit of claim 1, wherein the adjustable phase step-size is adjusted in response to a first step-size corresponding to data phase drift and a second step-size corresponding to the variable data bit-rate.

6. The circuit of claim 5, wherein the first step size and the second step-size are summed to obtain the adjustable phase step-size.

7. A circuit, comprising:
a clock circuit capable of generating a clock signal in response to an adjustable phase step-size; and
a sampler, coupled to the clock circuit, capable of receiving, in response to the clock signal, a data signal having a variable data bit-rate,
wherein the circuit includes an indicator capable of adjusting the adjustable phase step-size in response to the variable data bit-rate,
wherein the circuit includes a counter for obtaining a first step-size and the indicator provides a second step-size, wherein the first step-size and the second step-size are summed to obtain the adjustable phase step-size.

8. The circuit of claim 7, wherein the indicator includes a state machine capable of detecting the variable data bit-rate.

9. The circuit of claim 1, wherein the circuit includes an averaging circuit capable of averaging a plurality of up signals to obtain an average up value and a plurality of down signals to obtain an average down value, and outputting the adjustable phase step-size in response to a comparison of the average up value and the average down value.

10. The circuit of claim 1, wherein the circuit is included in a receive circuit coupled to a transmit circuit capable of transmitting the data signal.

11. A circuit, comprising:
a clock circuit capable of generating a clock signal in response to a phase adjust signal;
a sampler, coupled to the clock circuit, capable of receiving, in response to the clock signal, a data signal having a variable data bit-rate; and,
wherein the circuit comprises,
a first stage, coupled to the sampler, capable of outputting a first stage output signal in response to a sampled data signal;
a second stage, coupled to the first stage, capable of outputting a second stage output signal in response to the first stage output signal;
a third stage capable of outputting the phase adjust signal in response to the second stage output signal; and,
stall logic, coupled to the first, second and third stages, and capable of holding the phase adjust signal in response to the first and second stage output signals.

12. The circuit of claim 11, wherein the first and second stages are successive stages.

13. The circuit of claim 11, wherein the first and second stages are included in a phase detector.

14. The circuit of claim 11, wherein the third stage is included in a phase adjust controller.

15. A circuit, comprising:
a clock circuit capable of generating a clock signal in response to a phase adjust signal having an adjustable step-size; and,
a sampler capable of receiving, in response to the clock signal, a data signal having a variable data bit-rate;
wherein the circuit includes,
a first stage, coupled to the sampler, capable of outputting a first stage output signal in response to a sampled data signal;
a second stage, coupled to the first stage, capable of outputting a second stage output signal in response to the first stage output signal;
a third stage capable of outputting the phase adjust signal, having a first step-size, in response to the second stage output signal;
stall logic, coupled to the first, second and third stages, capable of holding the phase adjust signal in response to the first and second stage output signals;
an indicator, coupled to the third stage, capable of outputting a second step-size in response to the variable data bit-rate; and,
a counter, coupled to the third stage and the indicator, capable of outputting the phase adjust signal having the adjustable step-size in response to the first and second step-sizes.

16. The circuit of claim 15, wherein the first and second stages are successive stages.

17. The circuit of claim 15, wherein the first and second stages are included in a phase detector.

18. The circuit of claim 15, wherein the counter is capable of summing the first step-size and the second step-size to provide the adjustable step-size.

19. The circuit of claim 15, wherein the indicator includes a state machine capable of detecting the variable data bit-rate.

20. The circuit of claim 19, wherein the indicator is capable of outputting a first variable frequency phase step-size in response to a first variable bit-rate in a first state and capable of outputting a second variable frequency phase step-size in response to a second variable bit-rate in a second state.

21. The circuit of claim 20, wherein the first state transitions to a second state responsive to a difference of a number of up signals to a number of down signals, during a period of time, and a threshold value.

22. A method for tracking a signal, comprising:
receiving the signal;
outputting a plurality of digital data signals in response to an adjust signal and the signal;
selecting an update rate; and,
selecting an adjustable step-size for the adjust signal in response to the signal, wherein the selecting the adjustable step- size includes:
averaging a plurality of up signals to obtain an average up value;
averaging a plurality of down signals to obtain an average down value;
outputting the adjust signal in response to the average up value and average down value;
determining a first step-size based on variable data bit-rate of the signal;
determining a second step-size; and
summing the first and second step-size to obtain the adjustable step-size.

23. The method of claim 22, wherein the signal is received in response to a clock signal and wherein the update rate is a divisor of a frequency of a clock signal.

24. The method of claim 22, further comprising determining phase information associated with the plurality of digital data signals including:
deserializing the plurality of digital data signals to output a group of data bits in parallel;
comparing phases of the of the group of digital data bits with a phase of a clock signal to generate the plurality of up signals and the plurality of down signals; and
determining the phase information based on the plurality of up signals and the plurality of down signals.

25. The method of claim 22, wherein the signal is a data signal having the variable data bit-rate and the signal is received in response to the clock signal and further comprising:
updating a phase of the clock signal based on the adjustable step size.

26. The circuit of claim 1, wherein the circuit includes multiple pipelined stages that are controlled by a timing signal having a frequency that is a divisor of a frequency of the clock signal.

27. The circuit of claim 1, wherein the circuit further comprises a de-serializer coupled between an output of the sampler and the clock circuit, and wherein the circuit compares phases of a plurality of data bits output from the de-serializer with the phase of the clock signal to generate a plurality of up signals and a plurality of down signals, the circuit derives the data phase information based on the plurality of up signals and the plurality of down signals.

* * * * *

UNITED STATES PATENT AND TRADEMARK OFFICE
CERTIFICATE OF CORRECTION

| | | |
|---|---|---|
| PATENT NO. | : 7,668,271 B2 | Page 1 of 1 |
| APPLICATION NO. | : 10/675027 | |
| DATED | : February 23, 2010 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 772 days.

Signed and Sealed this

Twenty-eighth Day of December, 2010

David J. Kappos
*Director of the United States Patent and Trademark Office*